(12) United States Patent
Kubota

(10) Patent No.: US 12,154,767 B2
(45) Date of Patent: Nov. 26, 2024

(54) SUBSTRATE PROCESSING APPARATUS AND SUBSTRATE PROCESSING METHOD

(71) Applicant: Tokyo Electron Limited, Tokyo (JP)

(72) Inventor: Naoki Kubota, Fuchu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/179,424

(22) Filed: Mar. 7, 2023

(65) Prior Publication Data

US 2023/0290618 A1 Sep. 14, 2023

(30) Foreign Application Priority Data

Mar. 11, 2022 (JP) ................................. 2022-038101

(51) Int. Cl.
*H01J 37/32* (2006.01)

(52) U.S. Cl.
CPC .. *H01J 37/32651* (2013.01); *H01J 37/32183* (2013.01); *H01J 37/32715* (2013.01); *H01J 2237/332* (2013.01); *H01J 2237/335* (2013.01)

(58) Field of Classification Search
None
See application file for complete search history.

(56) References Cited

U.S. PATENT DOCUMENTS

2009/0242383 A1* 10/2009 Vukovic ................. C23C 14/50
204/164
2021/0343508 A1* 11/2021 Nguyen ............ H01J 37/32477

FOREIGN PATENT DOCUMENTS

JP 2004-158828 A 6/2004

* cited by examiner

*Primary Examiner* — Jason Berman
(74) *Attorney, Agent, or Firm* — Armstrong Teasdale LLP

(57) ABSTRACT

A substrate processing apparatus for processing a substrate by causing ions in plasma to act on the substrate, includes: a process container in which the substrate to be processed is accommodated, the process container configured to generate the plasma in an interior of the process container; a stage provided inside the process container and configured to place the substrate on the stage; a radio-frequency power source configured to apply radio-frequency power to the stage to cause the ions in the plasma to act on the substrate; a shield member provided inside the process container and having a driven portion; a drive mechanism configured to drive the driven portion of the shield member; and at least one flexible conductive connection plate configured to connect the driven portion of the shield member and a grounded portion and configured to be deformed in response to the driving of the driven portion.

16 Claims, 4 Drawing Sheets

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2022-038101, filed on Mar. 11, 2022, the entire contents of which are incorporated herein by reference.

TECHNICAL FIELD

The present disclosure relates to a substrate processing apparatus and a substrate processing method.

BACKGROUND

In a semiconductor device manufacturing process, there is a film-forming process for forming a film on a substrate, such as PVD or CVD. A natural oxide film is inevitably formed on the substrate. If a film-forming process is carried out in a state in which the natural oxide film is formed, film characteristics and the like may deteriorate. For this reason, it has been proposed that prior to a film-forming process, radio-frequency power is applied to a substrate and plasma of an Ar gas is caused to act on the substrate to clean a substrate surface by reverse sputtering.

PRIOR ART DOCUMENT

Patent Document

Patent Document 1: Japanese Laid-Open Patent Publication No. 2004-158828

SUMMARY

According to an embodiment of the present disclosure, there is provided a substrate processing apparatus for processing a substrate by causing ions in plasma to act on the substrate, includes: a process container in which the substrate to be processed is accommodated, the process container configured to generate the plasma in an interior of the process container; a stage provided inside the process container and configured to place the substrate on the stage; a radio-frequency power source configured to apply radio-frequency power to the stage to cause the ions in the plasma to act on the substrate; a shield member provided inside the process container and having a driven portion; a drive mechanism configured to drive the driven portion of the shield member; and at least one flexible conductive connection plate configured to connect the driven portion of the shield member and a grounded portion and configured to be deformed in response to the driving of the driven portion by the drive mechanism.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

An embodiment will be specifically described below with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
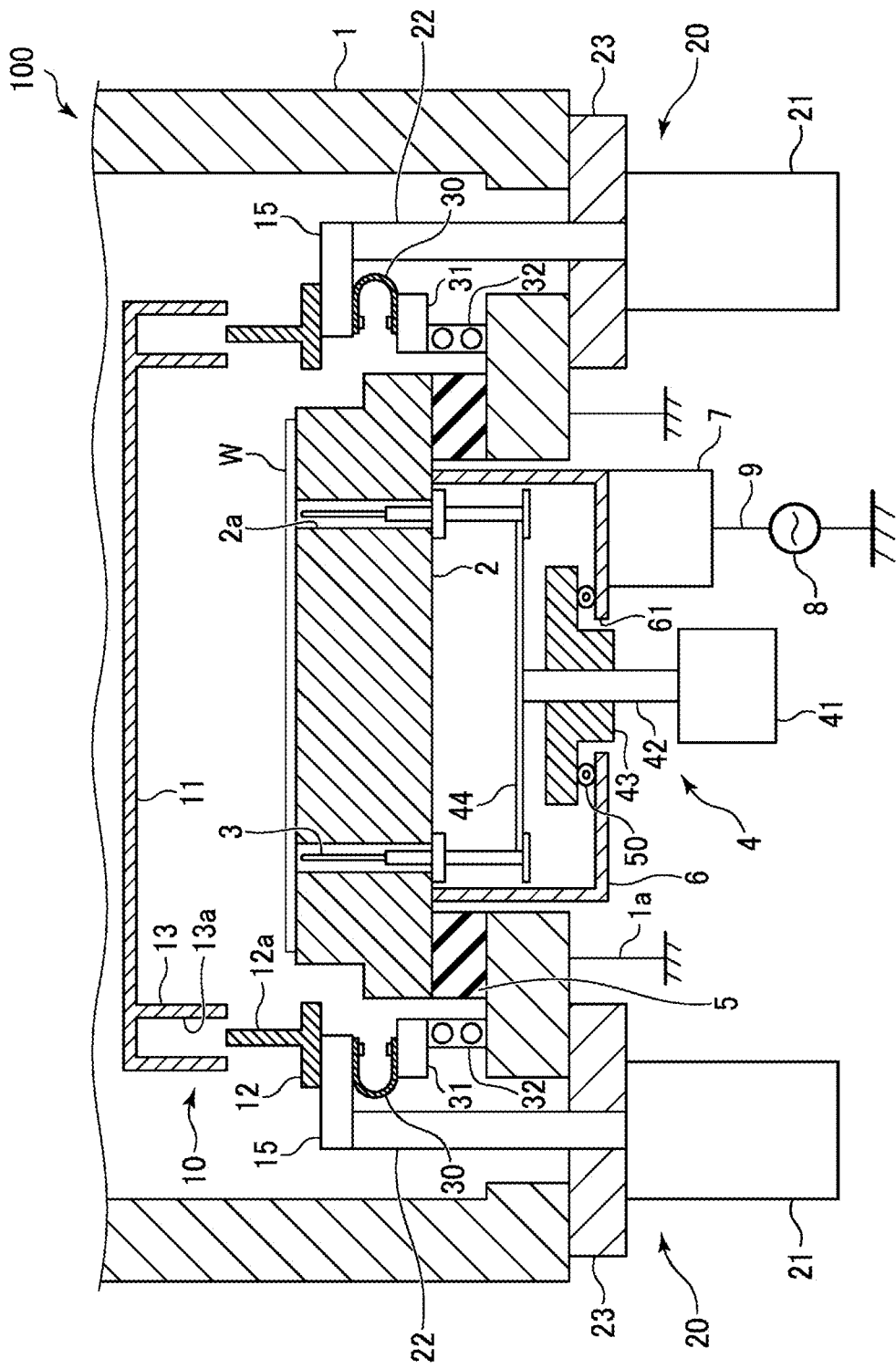
FIG. 1 is a sectional view showing a substrate processing apparatus according to an embodiment, in which a state during substrate transfer is shown.
Figure 2:
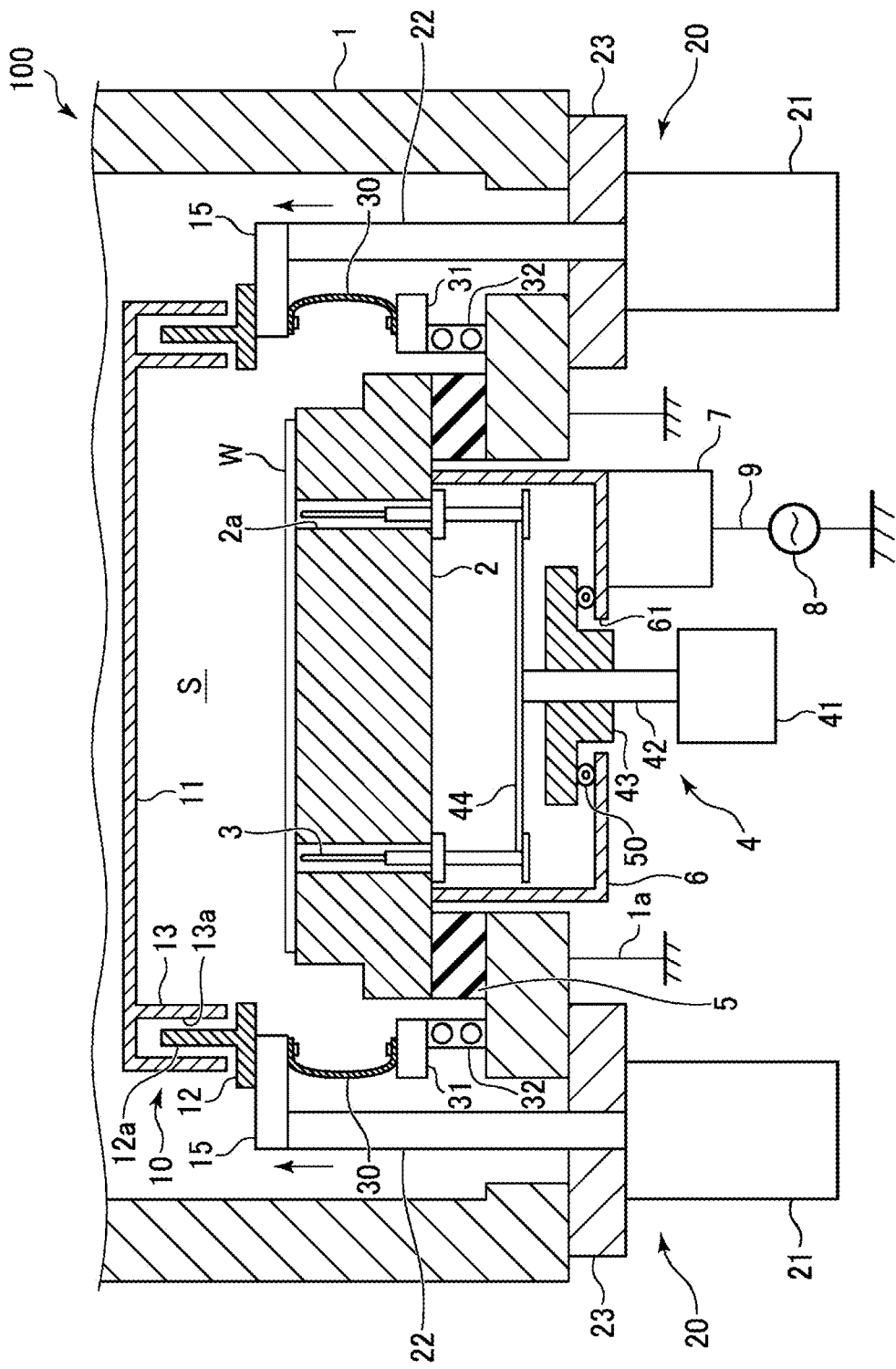
FIG. 2 is a sectional view showing the substrate processing apparatus according to an embodiment, in which a state during substrate processing is shown.

FIGS. 1 and 2 are sectional views showing a substrate processing apparatus according to an embodiment. FIG. 1 shows a state during substrate transfer, and FIG. 2 shows a state during substrate processing.

A substrate processing apparatus 100 cleans a surface of a substrate by reverse sputtering, and includes a substantially cylindrical metal-made process container 1. The process container 1 is grounded via a grounding line 1a. Inside the process container 1, a metal-made stage 2 for horizontally placing a substrate W thereon is provided. An insulating member 5 is interposed between the bottom of the process container 1 and the stage 2.

The interior of the process container 1 may be evacuated to a desired degree of vacuum by an exhaust device (not shown) equipped with a vacuum pump, a pressure control valve, and the like. A loading/unloading port (not shown) for the substrate W is provided on the sidewall of the process container 1. The loading/unloading port may be opened and closed by a gate valve (not shown). Further, a gas for plasma generation such as an Ar gas or the like is supplied into the process container 1 from a gas supply mechanism (not shown). Furthermore, the substrate processing apparatus 100 also includes a plasma generation mechanism (not shown) for generating plasma within the process container 1. Although the plasma generation mechanism is not particularly limited, a plasma generation mechanism that generates inductively coupled plasma or microwave plasma is exemplified as a suitable one.

A plurality of (e.g., three) insertion holes 2a are formed in the stage 2. A plurality of (e.g., three) lift pins 3 are inserted through the insertion holes 2a so as to move upward and downward with respect to an upper surface of the stage 2. The lift pins 3 are moved upward and downward by a driver 4 so as to move upward and downward with respect to the surface of the stage 2. The substrate W is transferred to and received from the stage 2 by raising and lowering the lift pins 3 with the driver 4. The stage 2 may include a heating mechanism or a cooling mechanism depending on the substrate processing.

A matching box fixing plate 6 is attached to the bottom of the stage 2. The driver 4 is supported by the matching box fixing plate 6. A hole is formed at the center of the bottom of the process container 1. The matching box fixing plate 6 and the driver 4 are provided so as to protrude downward through the hole.

The driver 4 includes a drive mechanism 41, a lift shaft 42, a flange portion 43 and a lift plate 44. The drive mechanism 41 is composed of a cylinder or the like, and is provided below the matching box fixing plate 6. A hole 61 is provided at the bottom of the matching box fixing plate 6. The lift shaft 42 extends upward from the drive mechanism 41 through the hole 61. The lift shaft 42 is guided by a hole formed in the flange portion 43 so as to be raised and lowered by the drive mechanism 41. The lift plate 44 is fixed to the upper end of the lift shaft 42. The lift pins 3 extending upward is fixed to the lift plate 44. Therefore, the lift pins 3 are moved upward and downward via the lift plate 44 by raising and lowering the lift shaft 42 with the drive mechanism 41. The flange portion 43 is supported by the matching box fixing plate 6 via the RF shield 50 while being inserted into the hole 61 of the matching box fixing plate 6. That is, the driver 4 is supported by the matching box fixing plate 6 via the RF shield 50. The RF shield 50 is configured to shield radio frequency (RF) supplied from a radio-frequency power source 8 and prevent the radio frequency from leaking to the outside from the hole 61 of the matching box fixing plate 6 that supports the driver 4. The RF shield 50 is a hollow annular body (having an O-ring shape).

A matching box 7 is fixed to the bottom of the matching box fixing plate 6. The radio-frequency power source 8 is connected to the matching box 7 via a feeder line 9. The matching box 7 is electrically connected to the stage 2 via a feeder line (not shown). Therefore, radio-frequency power is applied to the stage 2 from the radio-frequency power source 8 through the matching box 7. By applying the radio-frequency power to the stage 2, ions (positive ions) such as Ar ions or the like are drawn into the substrate W, whereby the surface of the substrate W is reverse-sputtered. An impedance matching circuit is provided inside the matching box 7. The impedance matching circuit is configured to match a load (plasma) impedance with an impedance on the side of the radio-frequency power source 8. The radio-frequency power source 8 may also function as a plasma generation mechanism to generate capacitively coupled plasma.

A shield member 10 made of metal (e.g., aluminum whose entire surface is blast-coated) is provided above the stage 2. The shield member 10 has an annular shape as a whole and functions as an anti-adhesion shield that prevents particles in plasma from adhering to the inner wall of the process container 1. The shield member 10 includes a fixed upper shield 11 and a lower shield 12 as a driven portion provided to be raised and lowered toward and away from the upper shield 11.

The upper shield 11 is fixed to the process container 1 by a fixing member (not shown). For example, the upper shield 11 is fixed to the bottom of the process container 1. An annular protrusion portion 13 protruding downward is formed on an outer peripheral portion of the upper shield 11. An annular groove portion 13a is formed in the protrusion portion 13. The lower shield 12 is provided with an annular protrusion portion 12a corresponding to the groove portion 13a. When the lower shield 12 is at a raised position shown in FIG. 2, the protrusion portion 12a is inserted into the groove portion 13a, whereby a processing space S is formed above the stage 2 on which the substrate W is placed, so that the substrate may be processed in the processing space S. On the other hand, when the lower shield 12 is at a lowered position shown in FIG. 1, the substrate W may be transferred to the stage 2. A hole (not shown) for loading and unloading the substrate W is formed in the protrusion portion 12a in a corresponding relationship with the loading/unloading port of the process container 1.

The lower shield 12 is configured to be raised and lowered by two elevating mechanisms 20. Each elevating mechanism 20 includes a cylinder 21 provided below the process container 1, a piston 22 extending upward from the cylinder 21 in the process container 1, and a flange portion 23 for attaching the cylinder 21 to the process container 1. A lower shield fixing member 15 is attached to an upper end of the piston 22. The lower shield 12 is fixed to the lower shield fixing member 15. The lower shield 12 is moved upward and downward by the elevating operation of the piston 22 of the elevating mechanism 20.

An annular grounding member 32 is provided at the bottom of the process container 1. An attaching member 31 is provided on the grounding member 32. The grounding member 32 includes a grounding gasket or a shield finger. The grounding member 32 is electrically connected to the process container 1. The attaching member 31 is connected to the grounding line of the process container 1 via the grounding member 32. That is, the attaching member 31 functions as a grounded portion.

Figure 3:
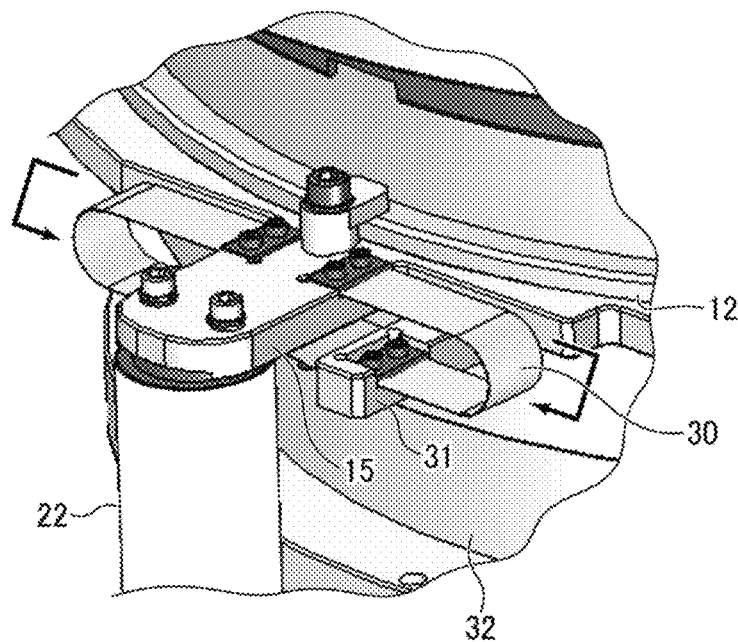
FIG. 3 is a perspective view showing a detailed structure of a main part of the substrate processing apparatus according to an embodiment.

The lower shield fixing members 15 respectively corresponding to the two elevating mechanisms 20 and the corresponding attaching members 31 are electrically connected to each other by conductive connection plates 30 having flexibility. The conductive connection plate 30 is fixed to the lower shield fixing member 15 and the attaching member 31 by screwing, and is deformed as the lower shield 12 moves upward and downward. In practice, as shown in the detailed perspective view of FIG. 3, two conductive connection plates 30 are screwed to the upper surface of the lower shield fixing member 15 and the upper surface of the attaching member 31. The number of elevating mechanisms 20 is not limited to two, but may be three or more. In that case, the conductive connection plate 30 may be provided on each lower shield fixing member 15 corresponding to each elevating mechanism 20.

The conductive connection plate 30 having flexibility is not particularly limited as long as it is made of a conductive material having flexibility. As an example, the conductive connection plate 30 may be made of copper (Cu), which has good conductivity.

The conductive connection plate 30 is configured to be compressed in a U-shape when the lower shield 12 is at the lowered position as shown in FIG. 1, and be expanded when the lower shield 12 is at the raised position as shown in FIG. 2.

As described above, the conductive connection plate 30 has flexibility and, therefore, may be deformed in response to the raising/lowering of the lower shield 12. The lower shield 12 may be connected to the grounding line of the process container 1 via the attaching member 31 by the conductive connection plate 30 regardless of the raised/lowered position of the lower shield 12.

Next, an operation of the substrate processing apparatus 100 configured as above will be described.

First, while the lower shield 12 of the shield member 10 is kept at the lowered position shown in FIG. 1, the substrate W is loaded into the process container 1 and placed on the stage 2. The placing of the substrate W is performed by delivering the substrate W onto the lift pins 3 by a transfer device (not shown) in a state in which the lift pins 3 protrude from the surface of the stage 2, and lowering the lift pins 3.

Subsequently, the lower shield 12 is raised to form the processing space S inside the shield member 10 as shown in FIG. 2.

In this state, a gas such as an Ar gas or the like is supplied into the process container 1 to generate plasma by the plasma generation mechanism. By applying radio-frequency power from the radio-frequency power source 8 to the stage 2, ions in the plasma, for example positive ions such as Ar ions, are drawn into the substrate W so that the surface of the substrate W is reverse-sputtered. As a result, a cleaning process for physically removing the surface layer of the substrate W is performed.

Examples of the cleaning process may include a natural oxide film removal process as a pretreatment for a film-forming process such as PVD or CVD. The cleaning process at this time is sufficient if it may remove the natural oxide film that is the surface layer.

In an apparatus using this type of plasma, generally, a metal shield member is provided inside the process container. The shield member has a structure that may be raised and lowered for loading and unloading a substrate. In the related art, such an elevating portion of the shield member is merely raised and lowered by an elevating mechanism, and is generally kept in an electrically floating state when the elevating portion is raised.

However, in such a case, it was found that if positive ions such as Ar ions are drawn into the substrate, negative charges may be accumulated in the elevating portion kept in the floating state (the elevating portion may be charged negatively), and the elevating portion may be reverse-sputtered to generate particles.

For example, when the elevating lower shield 12 is kept in an electrically floating state as in the present embodiment, if radio-frequency power is applied to the stage 2 to draw Ar ions into the substrate W during substrate processing, the lower shield 12 may be charged negatively, and reverse-sputtered to generate particles.

When the lower shield 12 is in the lowered state, the lower shield 12 is close to the bottom of the process container 1. Therefore, the negative charge may be easily released by connecting the lower shield 12 to the grounding line of the bottom of the process container 1. However, when the lower shield 12 is at the raised position, there is no grounding line nearby, and in the related art, the lower shield 12 has to remain in the floating state.

Therefore, in the present embodiment, the lower shield fixing member 15 for fixing the lower shield 12 and the attaching member 31 connected to the grounding line 1a of the process container 1 are electrically connected to each other by the conductive connection plate 30 having flexibility.

The conductive connection plate 30 having flexibility may be deformed in response to the raising/lowering of the lower shield 12. The lower shield 12 may be connected to the grounding line of the process container 1 by the conductive connection plate 30 via the attaching member 31 regardless of its raised/lowered position. Therefore, regardless of the position of the lower shield 12, the negative charges accumulated in the lower shield 12 may be released to the grounding line 1a via the conductive connection plate 30. Accordingly, it is possible to prevent the generation of particles due to reverse-sputtering of the lower shield 12. This makes it possible to suppress the adverse effect of the particles on the process.

Further, since the conductive connection plate 30 having flexibility is provided on the lower shield fixing member 15 for fixing the elevating mechanism 20 and the lower shield 12, it is easy to install the conductive connection plate 30. In addition, by providing the conductive connection plates 30 at the positions corresponding to the two (plural) elevating mechanisms 20, the electric charge may be released with ease.

Next, a method of adjusting the position of the lift pins 3 and fixing the RF shield will be described.

Figure 4:
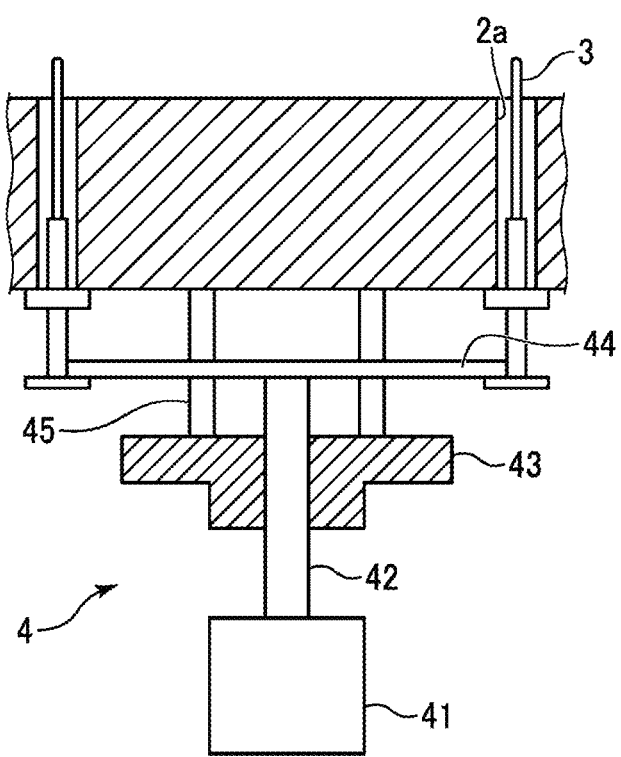
FIG. 4 is a sectional view for explaining a position adjustment of lift pins.

The position of the lift pins 3 are adjusted as shown in FIG. 4. First, the stage 2 and the flange portion 43 are fixed by the fixing member 45, and the driver 4 is fixed to the stage 2. Subsequently, the horizontal position of the lift pins 3 is adjusted so that the lift pins 3 are positioned optimally with respect to the insertion holes 2a of the stage 2.

Figure 5:
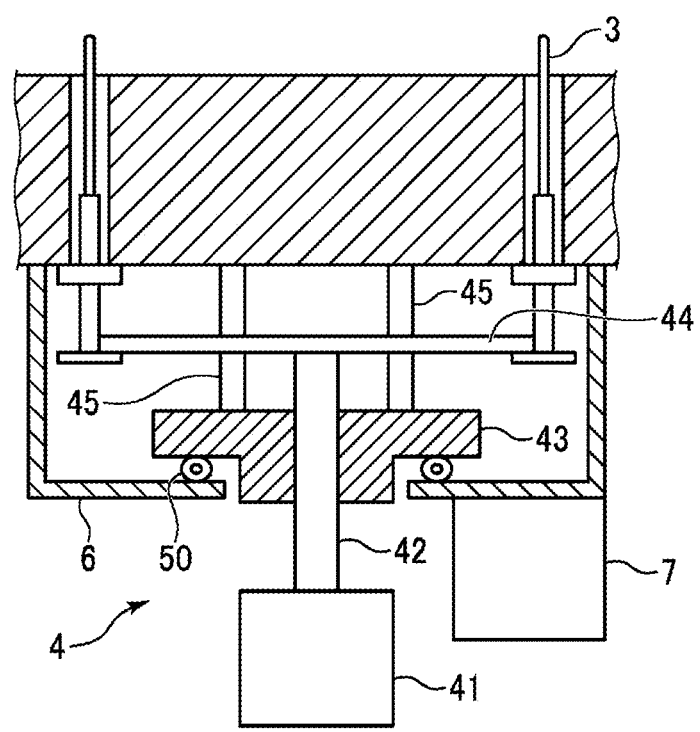
FIG. 5 is a sectional view for explaining fixing an RF shield after the position adjustment of the lift pins.

After the position of the lift pins 3 is adjusted, the RF shield 50 is fixed. As shown in FIG. 5, the RF shield 50 is fixed by attaching the RF shield 50 to the lower surface of the flange portion 43 of the driver 4, then pressing the matching box fixing plate 6 against the RF shield 50 and fixing the RF shield 50 by appropriate fixing means such as screws or the like.

In the present embodiment, the RF shield 50 is made of a material having electrical conductivity and rubber elasticity. The RF shield 50 is configured by, for example, adding a conductive material as a filler or an adhesive to a resin base having rubber elasticity. Silicone rubber is exemplified as the resin base, and silver-plated aluminum is exemplified as the conductive material.

Since the RF shield 50 has rubber elasticity as described above, it is possible to prevent the lift pins 3 from being shifted when the flange portion 43 of the driver 4 and the matching box fixing plate 6 are fixed to each other.

In the related art, a metal RF shield has been used as a typical RF shield. However, when using the metal RF shield, if the RF shield is fixed between the flange portion 43 of the lift part 4 and the matching box fixing plate 6 by for example, screws, after adjusting the position of the lift pins 3, the flange portion 43 may be twisted when tightening the screws. At this time, the position of the lift pins 3 is shifted correspondingly and, therefore, the lift pins 3 need to be readjusted. Thus, the adjustment work becomes complicated.

On the other hand, when the RF shield 50 made of a material having conductivity and rubber elasticity is used as in the present embodiment, even if the flange portion 43 and the matching box fixing plate 6 are fixed by, for example, screws with the RF shield 50 interposed therebetween, force applied at that time is absorbed by the RF shield 50. Therefore, the readjustment of the lift pins 3 is not required, and the adjustment work may be performed efficiently.

Although the embodiment has been described above, the embodiment disclosed this time should be considered to be exemplary and not limitative in all respects. The above-described embodiment may be omitted, substituted, or modified in various ways without departing from the scope and spirit of the appended claims.

For example, in the above-described embodiment, there has been described the example in which, as substrate processing, the surface of the substrate is cleaned by applying radio-frequency power to the substrate on the stage of the substrate and drawing ions such as Ar ions in plasma into the substrate. However, the present disclosure is not limited thereto.

Further, the substrate processing apparatus of the above-described embodiment is nothing more than an example. The structure of the shield member 10, the structure and number of the elevating mechanisms 20, the attaching form of the conductive connection plate 30 having flexibility, and the like are not limited to the above-described embodiment.

According to the present disclosure in some embodiments, it is possible to suppress particles from being generated due to reverse-sputtering of a driven portion of a shield member provided in a process container when processing a substrate by reverse-sputtering.

What is claimed is:

1. A substrate processing apparatus for processing a substrate by causing ions in plasma to act on the substrate, comprising:
   a process container in which the substrate to be processed is accommodated, the process container being configured to generate the plasma in an interior of the process container;
   a stage provided inside the process container and configured to place the substrate on the stage;
   a radio-frequency power source configured to apply radio-frequency power to the stage to cause the ions in the plasma to act on the substrate;
   a shield member provided inside the process container and having a driven portion;
   a drive mechanism configured to drive the driven portion of the shield member; and
   at least one flexible conductive connection plate configured to connect the driven portion of the shield member and a grounded portion and configured to be deformed in response to the driving of the driven portion by the drive mechanism,
   wherein the shield member includes a fixed upper shield and a lower shield, which functions as the driven portion and is configured to be raised and lowered toward and away from the fixed upper shield, and
   wherein the drive mechanism includes a plurality of elevating mechanisms configured to raise and lower the lower shield, and the at least one flexible conductive connection plate includes a plurality of flexible conductive connection plates provided at a plurality of positions corresponding to the plurality of elevating mechanisms.

2. The substrate processing apparatus of claim 1,
   wherein the fixed upper shield and the lower shield form a processing space for processing the substrate when the lower shield is at a raised position.

3. The substrate processing apparatus of claim 2, wherein the fixed upper shield is fixed to the process container by a fixing member.

4. The substrate processing apparatus of claim 3, wherein the at least one flexible conductive connection plate is configured to be deformed such that the at least one flexible conductive connection plate retracts in a U shape when the lower shield is at a lowered position and expands when the lower shield is at the raised position.

5. The substrate processing apparatus of claim 1, wherein the grounded portion is grounded through the process container.

6. The substrate processing apparatus of claim 5, wherein the grounded portion is a grounding member having a grounding gasket or a shielding finger.

7. The substrate processing apparatus of claim 6, wherein the at least one flexible conductive connection plate is made of copper.

8. The substrate processing apparatus of claim 7, wherein the plasma inside the process container contains positive ions, and
   the positive ions act on the surface of the substrate when the radio-frequency power is applied to the stage so that negative charges are accumulated in the driven portion of the shield member, and the negative charges are released through the at least one flexible conductive connection plate.

9. The substrate processing apparatus of claim 8, wherein the plasma is argon gas plasma, and argon ions in the plasma act on the surface of the substrate.

10. The substrate processing apparatus of claim 9, further comprising:
    a plurality of lift pins inserted through insertion holes formed in the stage, and configured to move upward and downward with respect to an upper surface of the stage so as to raise and lower the substrate;
    a driver configured to raise and lower the plurality of lift pins;
    a matching box configured to perform impedance matching for the radio-frequency power source;
    a matching box fixing plate configured to fix the matching box; and
    a radio-frequency shield fixed between the driver and the matching box fixing plate to shield radio frequencies from the radio-frequency power source,
    wherein the radio-frequency shield is made of a material having conductivity and rubber elasticity.

11. The substrate processing apparatus of claim 2, wherein the at least one flexible conductive connection plate is configured to be deformed such that the at least one flexible conductive connection plate retracts in a U shape when the lower shield is at a lowered position and expands when the lower shield is at the raised position.

12. The substrate processing apparatus of claim 1, wherein the at least one flexible conductive connection plate is made of copper.

13. The substrate processing apparatus of claim 1, wherein the plasma inside the process container contains positive ions, and
    the positive ions act on the surface of the substrate when the radio-frequency power is applied to the stage so that negative charges are accumulated in the driven portion of the shield member, and the negative charges are released through the at least one flexible conductive connection plate.

14. A substrate processing apparatus for processing a substrate by causing ions in plasma to act on the substrate, comprising:
    a process container in which the substrate to be processed is accommodated, the process container being configured to generate the plasma in an interior of the process container;
    a stage provided inside the process container and configured to place the substrate on the stage;
    a radio-frequency power source configured to apply radio-frequency power to the stage to cause the ions in the plasma to act on the substrate;
    a shield member provided inside the process container and having a driven portion;
    a drive mechanism configured to drive the driven portion of the shield member;
    at least one flexible conductive connection plate configured to connect the driven portion of the shield member and a grounded portion and configured to be deformed in response to the driving of the driven portion by the drive mechanism;
    a plurality of lift pins inserted through insertion holes formed in the stage, and configured to move upward and downward with respect to an upper surface of the stage so as to raise and lower the substrate;

a driver configured to raise and lower the plurality of lift pins;

a matching box configured to perform impedance matching for the radio-frequency power source;

a matching box fixing plate configured to fix the matching box; and a radio-frequency shield fixed between the driver and the matching box fixing plate to shield radio frequencies from the radio-frequency power source, wherein the radio-frequency shield is made of a material having conductivity and rubber elasticity.

15. A substrate processing method of processing a substrate by causing ions in plasma to act on the substrate using a substrate processing apparatus that includes a process container in which the substrate to be processed is accommodated, a stage provided inside the process container and configured to place the substrate on the stage, a radio-frequency power source configured to apply radio-frequency power to the stage to cause the ions in the plasma to act on the substrate, a shield member provided inside the process container and including a fixed upper shield and a lower shield configured to be raised and lowered toward and away from the fixed upper shield, and a drive mechanism configured to drive the lower shield, the substrate processing method comprising:

provinding at least one flexible conductive connection plate between a driven portion of the shield member and a grounded portion;

loading the substrate into the process container and placing the substrate on the stage in a state in which the lower shield is located at a lowered position and the at least one flexible conductive connection plate is retracted;

moving the lower shield to a raised position to expand the at least one flexible conductive connection plate responsive to the movement of the lower shield to the raised position;

processing the substrate by generating the plasma inside the process container in a state in which the lower shield is located at the raised position and applying the radio-frequency power to the stage to cause the ions in the plasma to act on a surface of the substrate; and releasing electrical charges accumulated on the lower shield during the processing of the substrate through the at least one flexible conductive connection plate and the grounded portion, wherein the drive mechanism includes a plurality of elevating mechanisms configured to raise and lower the lower shield, and the at least one flexible conductive connection plate includes a plurality of flexible conductive connection plates provided at a plurality of positions corresponding to the plurality of elevating mechanisms.

16. A substrate processing method of processing a substrate by causing ions in plasma to act on the substrate using a substrate processing apparatus that includes a process container in which the substrate to be processed is accommodated, a stage provided inside the process container and configured to place the substrate on the stage, a radio-frequency power source configured to apply radio-frequency power to the stage to cause the ions in the plasma to act on the substrate, a shield member provided inside the process container and including a fixed upper shield and a lower shield configured to be raised and lowered toward and away from the fixed upper shield, a drive mechanism configured to drive the lower shield, a plurality of lift pins inserted through insertion holes formed in the stage and configured to move upward and downward with respect to an upper surface of the stage so as to raise and lower the substrate, a driver configured to raise and lower the plurality of lift pins, a matching box configured to perform impedance matching for the radio-frequency power source, a matching box fixing plate configured to fix the matching box, and a radio-frequency shield fixed between the driver and the matching box fixing plate to shield radio frequencies from the radio-frequency power source, the substrate processing method comprising:

providing at least one flexible conductive connection plate between a driven portion of the shield member and a grounded portion;

loading the substrate into the process container and placing the substrate on the stage in a state in which the lower shield is located at a lowered position and the at least one flexible conductive connection plate is retracted;

moving the lower shield to a raised position to expand the at least one flexible conductive connection plate responsive to the movement of the lower shield to the raised position;

processing the substrate by generating the plasma inside the process container in a state in which the lower shield is located at the raised position and applying the radio-frequency power to the stage to cause the ions in the plasma to act on a surface of the substrate; and releasing electrical charges accumulated on the lower shield during the processing of the substrate through the at least one flexible conductive connection plate and the grounded portion, wherein the radio-frequency shield is made of a material having conductivity and rubber elasticity.

* * * * *